United States Patent [19]
Brehmer

[11] Patent Number: 5,457,426
[45] Date of Patent: Oct. 10, 1995

[54] OPERATIONAL AMPLIFIER FOR LOW SUPPLY VOLTAGE APPLICATIONS

[75] Inventor: Geoffrey E. Brehmer, Austin, Tex.

[73] Assignee: Advanced Micro Devices, Inc., Austin, Tex.

[21] Appl. No.: 85,898

[22] Filed: Jun. 30, 1993

[51] Int. Cl.$^6$ .................................................. H03F 3/45
[52] U.S. Cl. ..................... 330/253; 330/255; 330/257; 330/261
[58] Field of Search .................................. 330/253, 255, 330/257, 261, 311

[56] References Cited

U.S. PATENT DOCUMENTS

| | | |
|---|---|---|
| 4,730,168 | 3/1988 | Senderowicz et al. ................. 330/253 |
| 4,897,611 | 1/1990 | Laber et al. ............................ 330/253 |

FOREIGN PATENT DOCUMENTS

| | | | |
|---|---|---|---|
| 57810 | 3/1989 | Japan .................................... | 330/253 |

OTHER PUBLICATIONS

Fukahori, "A CMOS Narrow–Band Signaling Filter with Q Reduction", *IEEE Journal of Solid–State Circuits*, vol. SC–19, No. 6, Dec. 1984 pp. 926–931.
Ribner et al, "Design Techniques for Cascaded CMOS Op Amps with Improved PSRR and Common–Input Range", *IEEE Journal of Solid–State Circuits*, vol. SC–19, No. 6, Dec. 1984 pp. 919–925.
Ahuja et al, "A Programmable CMOS Dual Channel Interface Processor for Telecommunications Applications," *IEEE Journal of Solid–State Circuits*, vol. SC–19, No. 6 Dec. 1984, pp. 892 899.
Klaas Bult and Govert J. G. M. Geelen, "A Fast–Settling CMOS Op Amp for SC Circuits with 90–dB DC Gain", *IEEE Journal of Solid–State Circuits*, vol. 25, No. 6, Dec. 1990, pp. 1379 through 1384.
Andre Abrial, Jacky Bouvier, Jean–Michel Fournier, Patrice Senn and Michel Veillard, "A 27–MHz Digital–To–Analog Video Processor", *IEEE Journal of Solid–State Circuits*, vol. 23, No. 6, Dec. 1988, pp. 1358 through 1369.

*Primary Examiner*—James B. Mullins
*Attorney, Agent, or Firm*—H. Dale Langley, Jr.

[57] ABSTRACT

An operational amplifier for low supply voltage applications. The operational amplifier includes inverting and non-inverting inputs and a single-ended output. The operational amplifier also includes source transistors for pushing the output and sink transistors for pulling the output to obtain particular output voltage swing. Connections between the inputs and output include DC biasing circuitry. In low supply voltage applications, voltage drop due to transistors of amplifier circuitry can be significant and can affect possible range of output voltage swing. The DC biasing circuitry includes four identically sized n-channel transistors; three of the n-channel transistors receive a second bias current input and one of the n-channel transistors receives a first bias current input, identical to the first three identically sized n-channel cascode transistors are connected to the n-channel transistor that receives the first bias current input and to two of the n-channel transistors receiving the second bias current input; the other n-channel transistor receives the second bias current input and is connected to a correcting transistor of select size and characteristics. The correcting transistor serves to maintain mirrored currents between each of the source transistors and each of the sink transistors to eliminate the implications of inequivalent voltage drop across corresponding series of transistors in the amplifier so that the range of output voltage swing, even in low supply voltage applications, closely approaches the value of the power supply voltage.

5 Claims, 3 Drawing Sheets

SINGLE STAGE AMPLIFIER SECTION

DC BIASING CIRCUITRY

OPERATIONAL AMPLIFIER FOR LOW SUPPLY VOLTAGE APPLICATIONS

BACKGROUND OF THE INVENTION

1. Field of the Invention

The invention relates to operational amplifiers, and, more particularly, to operational amplifiers for low supply voltage applications, which employ unique DC biasing and current mirroring schemes.

2. Background of the Invention

Operational amplifiers are very high gain DC-coupled amplifiers with single-ended output. Typically, differential amplifiers are used as the input stage for operational amplifiers (sometimes referred to herein as "op-amp"). Operational amplifiers may be thought of as devices with two inputs and one output. The two inputs may be thought of as "non-inverting" and "inverting" signals. When the non-inverting input goes more positive than the inverting input, the output of the amplifier goes positive, and vice-versa. Operational amplifiers have enormous voltage gain and they are typically used with feedback.

An ideal op-amp with external feedback has a relatively simple behavior. First, the output from the op-amp attempts to do whatever is necessary to make the voltage difference between the op-amp inputs equal 0. Second, the op-amp draws very little input current which, in the ideal situation, approximates no current. In effect, operational amplifiers behave by "looking" at the input terminals and swinging the output terminal around so that the external feedback network brings the input differential to 0 (if possible). In this ideal op-amp, the output voltage swing may be as great as the range of power supply operating voltage. For example, if a power supply yielding a 0 to 5 volt supply voltage range operates an op-amp, then the output voltage swing can theoretically be 0–5 volts. Likewise, in the case of a power supply yielding a 0 to 2.7 volt supply voltage range for an op-amp, a 0–2.7 volt output swing is theoretically possible. So these are the ideal cases for a 0–5 supply voltage and a 0–2.7 supply voltage, respectively.

In the real world, these ideal conditions cannot be absolutely met. The real world op-amp will be operable around some range at about the mid-voltage of the power supply operating voltage range, and the output voltage will swing around this mid-voltage plus or minus some ΔV, which is something less than the theoretical output voltage possible given the range of supply voltage available from the power supply. In practice, op-amps typically work best at around a mid voltage, which is considered the common level voltage. That common level voltage will then swing up to the plus or minus ΔV which is possible based on the particular configuration.

One technique to obtain desired operation of an amplifier, such as desired output voltage swing, is termed "biasing." In biasing techniques, voltages are applied to corresponding transistor elements through biasing circuitry networks. These biasing circuitry networks can serve a number of purposes, and, in any case of use of a biasing network, biasing for one purpose may affect other aspects of amplifier circuit operation.

One biasing technique, sometimes referred to as matched base-emitter biasing, can be used to make what is called a current mirror. A current mirror is important in differential amplifier devices in a number of instances where a current source is needed. A common arrangement for a current mirror is sometimes referred to as a Wilson mirror. The Wilson mirror is a pair of gm p-channel or n-channel devices connected in series. This arrangement has one leg carrying a reference current which is mirrored by the two transistors in series in the other leg. This technique works to sufficiently mirror current in most cases. However, in low power applications, a relatively significant voltage drop occurs across the two transistors in series. That voltage drop takes up a significant amount of the possible output voltage swing of the amplifier, so the actual output voltage swing is often within a narrower range than the range of operating voltage available from the power supply.

The present invention is an operational amplifier designed to work with low supply voltages and yet meet the output range performance requirements found in higher voltage applications. The present invention amplifier is thought to be particularly effective when employed in battery powered or portable communication products. In particular, the amplifier solves many diverse problems found in low power applications in the related art, for example, problems of gain-band width, output swing, stability, and manufacturability. As will become apparent, this amplifier resolves many of these problems of the prior art due to the amplifier's unique DC biasing scheme for sinking and sourcing transistors and its unique current mirroring scheme to form the single-ended output.

SUMMARY OF THE INVENTION

In one embodiment, the invention is an operational amplifier. The operational amplifier comprises an inverting input, a non-inverting input, an output, and means for connecting the inverting input and the non-inverting input and the output, the means capable of causing the output to swing over substantially the entire range of voltage from the power supply.

In another aspect, the operational amplifier further comprises means, connected to the output, for pushing the output high and means, connected to the output, for pulling the output low.

In a further aspect, the operational amplifier further comprises at least one cascode means connected to the means for pushing and at least one cascode means connected to the means for pulling.

In even another aspect, the operational amplifier's means for connecting includes DC biasing circuitry.

In yet another aspect, the DC biasing circuitry of the operational amplifier establishes bias voltages on the means for pulling, thereby maintaining the means for pulling in saturation for the entire range of output.

In even a further aspect, the operational amplifier further comprises at least one cascode means connected to the means for pushing and at least one cascode means connected to the means for pulling, wherein the DC biasing circuitry also establishes bias voltages on the at least one cascode means connected to the means for pushing and on the at least one cascode means connected to the means for pulling.

In even a further aspect, the operational amplifier's means for pushing is at least one source transistor and the means for pulling is at least one sink transistor.

In another further aspect, the operational amplifier's means for connecting includes DC biasing circuitry, the DC biasing circuitry including four identically sized n-channel transistors, three of the n-channel transistors receiving a second bias current input and one of the n-channel transistors receiving a first bias current input, and three identically sized n-channel sink transistors connected to the n-channel transistor receiving the first bias current input and to two of the n-channel transistors receiving the second bias current input, said other of the n-channel transistors receiving the second bias current input and being connected to a select transistor having desired characteristics to maintain current mirroring between each of the at least one source transistors and between each of the at least one sink transistors, thereby causing the at least one source transistors and the at least one sink transistors to remain in the saturation region for the entire range of output swing.

In another embodiment, the invention is DC biasing circuitry of an operational amplifier having dual inputs and a single-ended output, and further having p-channel source transistors and n-channel sink transistors, the DC biasing circuitry having the improvement wherein the DC biasing circuitry causes the output to be pushed high when the voltage differential between the dual inputs is positive to bring the voltage level of the output near the value of the power supply voltage and to be pulled low when the voltage differential between the dual inputs is negative to bring the voltage level of the output near the value of the lowest power supply, ground.

In yet another embodiment, the invention is a method of biasing an operational amplifier having dual inputs and a single-ended output, the amplifier being comprised of sinking transistors and sourcing transistors and corresponding biasing transistors, the method comprising the step of sizing at least one correcting transistor to account for voltage differential between dual biasing currents across the biasing transistors to yield substantially identical biasing currents to all sinking transistors and substantially identical biasing currents to all sourcing and sinking transistors.

In another aspect, the method further comprises the step of connecting cascode transistors to each of the sourcing transistors and the sinking transistors.

In yet another aspect, in the method, the power supply voltage ranges from about 0 volts to about 2.7 volts.

In even another aspect, in the method, the power supply voltage ranges from about 0 volts to about 5 volts.

BRIEF DESCRIPTION OF THE DRAWINGS

For a more complete understanding of the present invention and for further objects and advantages thereof, reference may now be had to the following description in conjunction with the accompanying drawings, in which.

DETAILED DESCRIPTION OF THE INVENTION

Figure 1:
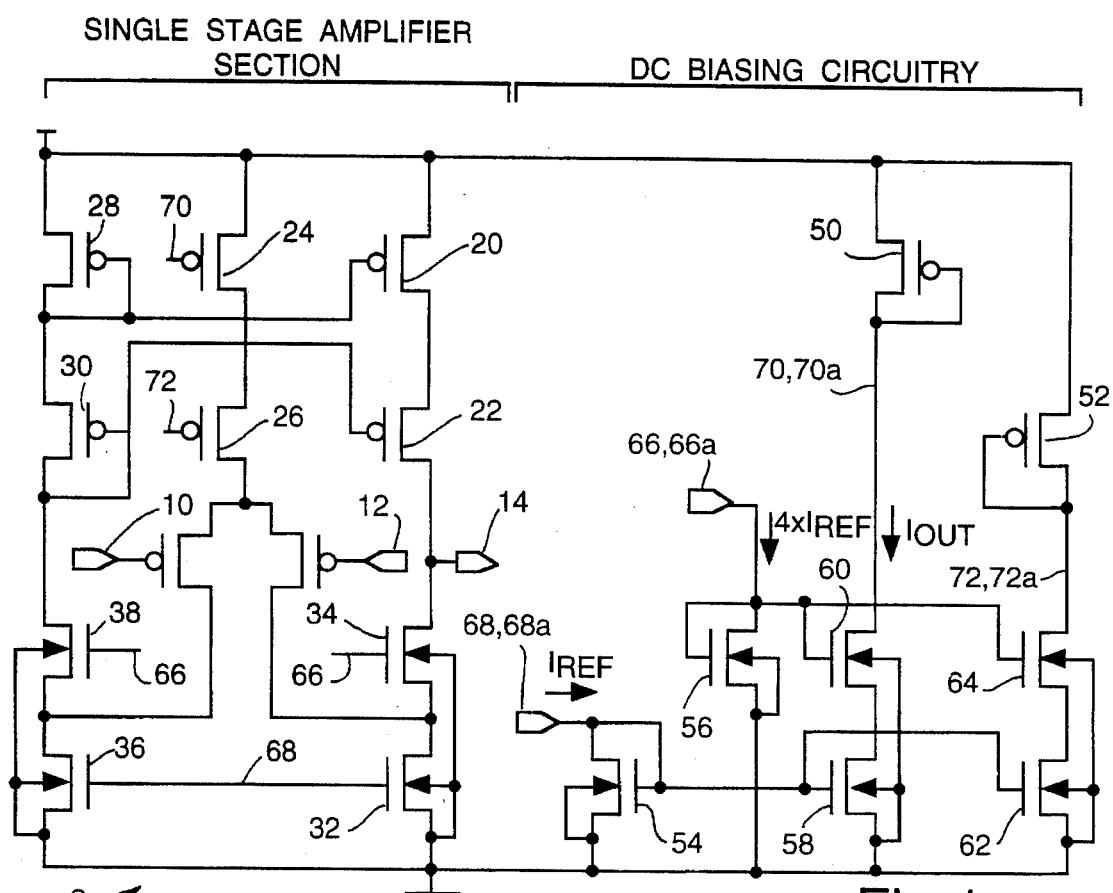
FIG. 1 is a detailed schematic representation of a prior art, single stage amplifier, utilizing classical methods for biasing and current mirroring.

In order to understand the principles and advantages of the present invention, it is helpful to first consider a prior art single stage operational amplifier and its operation and characteristics. Referring first to FIG. 1, such a prior art single stage amplifier 2 is shown. The amplifier 2 generally includes a single stage amplifier section and a network of DC biasing circuitry. Inputs to the single stage amplifier consist of an inverting input 12 and a non-inverting input 10. The amplifier 2 has a single-ended output 14. The amplifier section also includes an arrangement of p-channel transistors 20, 22, 24, 26, 28, 30 and an arrangement of n-channel transistors 32, 34, 36, 38.

Continuing to refer to FIG. 1, the amplifier section includes an input stage and an output stage. The input stage of the amplifier 2 includes the inputs 10, 12, transistors 24, 26, and biasing currents 70, 72 having bias voltages 70a, 72a for those transistors. The output stage of the amplifier includes output 14, transistors 20, 22, 32, 34, and biasing currents 66, 68 having bias voltages 66a, 68a. As will be apparent to those skilled in the art, the p-channel transistors 20, 28 serve as current sources with cascode devices 22, 30 and the n-channel transistors 32, 36 serve as current sinks with cascode devices 34, 38.

Still referring to FIG. 1, the network of DC biasing circuitry of the prior art single stage amplifier 2 includes p-channel transistors 50, 52 and n-channel transistors 54, 56, 58, 60, 62, 64. Current inputs 66, 68 to these n-channel transistors 54, 56, 58, 60, 62, 64 of the DC biasing circuitry are seen to also appear as bias voltage inputs 66a, 68a to the n-channel cascode devices 32, 34, 36, 38. The current inputs 70, 72 to the p-channel transistors 50, 52 are seen to appear as bias voltage inputs 70a, 72a to the input stage transistors 24, 26.

Further referring to FIG. 1, the prior art amplifier 2 operates as follows: When there is a difference in the voltages of the inputs 10, 12, a current imbalance is created in the output stage to either the source or sinking transistors so that more current is being sourced or sinked, depending on the polarity of the imbalance. For example, if the two inputs 10, 12 have identical voltages, the differential pair is split evenly and the circuitry creates a current sink that has the same current as the current source. Then, as one potential comes up and the other potential comes down, a current imbalance results in the output stage such that there's more current being sourced or sinked, depending upon the direction of the imbalance.

Figure 2:
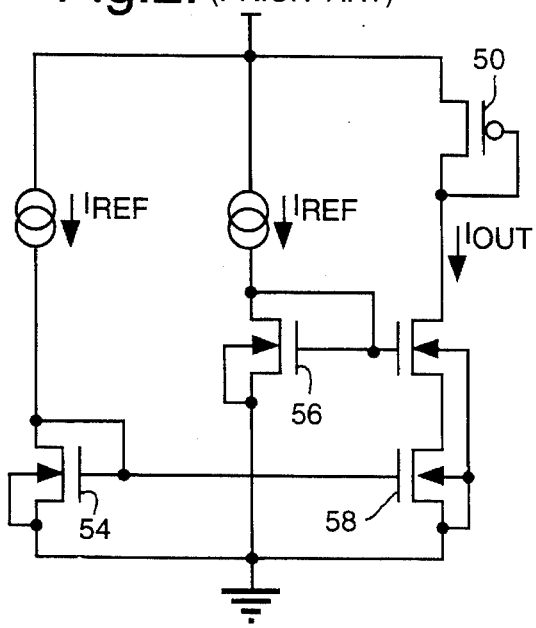
FIG. 2 is a detailed illustration of the DC biasing and current mirroring circuitry of the prior art single stage amplifier of FIG. 1.

Continuing to refer to FIG. 1 now in conjunction with FIG. 2 which more particularly illustrates the DC biasing and current mirroring circuitry of the prior art amplifier 2, the classical manner for sizing this prior art biasing network is to set all of the biasing network n-channel transistors 54, 56, 58, 60, 62, 64 equal in size and to source four times the drain current into transistor 56. This technique creates a $V_{ds}$ across transistor 56 equal to $V_t + 1.4 V_{dsat}$ and since the $V_t$ of transistor 56 and transistor 60 are similar (the $V_t$ of transistor 60 will actually be slightly higher due to body effects, though those effects are negligible relatively speaking), the gate to source drop across transistor 60 will cause transistor 58 to be biased with a $V_{ds}$ of about 1.3 $V_{dsat}$ which will keep transistor 58 in saturation.

Still referring to FIG. 1 in conjunction with FIG. 2, this biasing and current mirroring technique of the prior art is fundamentally problematic because the mirroring transistor 58 in one leg of the current mirror circuitry has a smaller voltage drop $V_{ds}$ than the single transistor 54 in the other leg. This difference in voltage drop between the two legs of the mirroring circuitry causes a mismatch in the current mirror output. The mismatch, though small, can be significant in cases in which the entire device operates at low voltage, and, in those cases, the mismatch can affect the entire operating characteristics of the operational amplifier. In addition to differences in voltage drop across transistors in legs of the mirroring circuitry, the transistor $V_{ds}$ and, thus, the current mismatch in the mirroring circuitry of the prior art design, can vary as a result of process, temperature, supply voltage, and reference current changes. Even further, changes in transistor sizes employed in the circuitry can result in significant mismatch problems because there is no easy way of changing transistor sizes in the prior art design and still effecting desired current mirroring. Thus, as is and will become more apparent, the present invention, which substantially reduces the mismatch in a wide variety of circumstances, is a significant improvement in the art, in particular, in low supply voltage applications.

Figure 3:
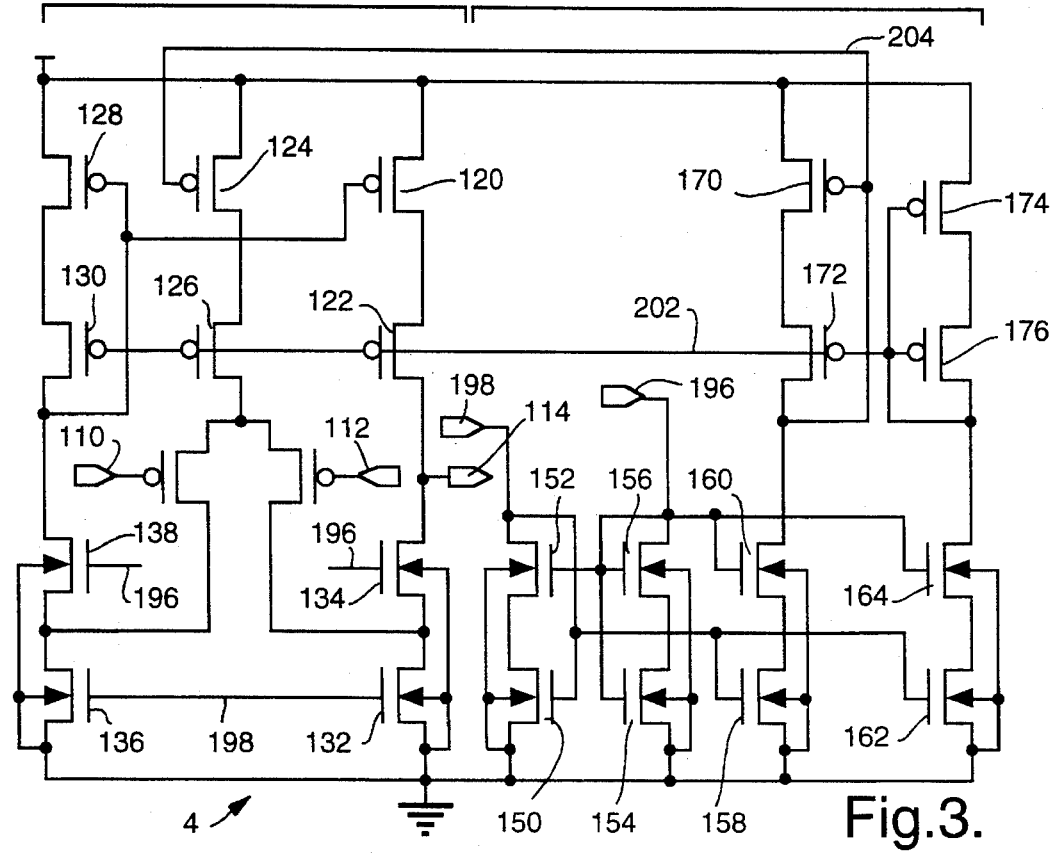
FIG. 3 is a detailed schematic representation of the preferred embodiment of the amplifier circuit of the present invention, having unique DC biasing and current mirroring schemes.

Now referring to FIG. 3, a preferred embodiment of a single stage, single ended amplifier 4 of the present invention is illustrated. This amplifier 4 is designed to have a minimum voltage drop across the p-channel source transistors 120, 124, 128 so that the output 114 can swing over a greater range. This design and its advantages will be more fully understood through the following descriptions. In general, the amplifier 4 is organized similar to the prior art amplifier 2 in many respects. The present invention includes both a single stage amplifier section and a network of DC biasing circuitry. The single stage amplifier section has inputs of an inverting input 112 and a non-inverting input 110. The amplifier 4 also has a single-ended output 114 The amplifier section consists of an arrangement of p-channel transistors 120, 122, 124, 126, 128, 130 and an arrangement of n-channel transistors 132, 134, 136, 138.

Still referring to FIG. 3, the DC biasing circuitry of the amplifier 4 is seen to consist of p-channel transistors 170, 172, 174, 176 and n-channel transistors 150, 152, 154, 156, 158, 160, 162, 164. Inputs to the DC biasing circuitry include dual biasing circuitry inputs 196, 198 of identical current. The function of the DC biasing circuitry in this preferred embodiment, and the primary difference in this amplifier 4 compared to the prior art, is that the DC biasing circuitry of the present amplifier serves to establish bias voltages on the current source, transistor 124, and the current sinks, transistors 132, 136, and on the cascode devices, transistors 122, 126, 130, 134, 138. In this manner, the current mirroring between transistor 128 and transistor 120 and the current sinks, transistor 132 and transistor 136, cause those transistors to remain in the saturation region for all values of output swing.

Still referring to FIG. 3, the amplifier functions as follows: When the voltages of the inputs 112, 110 are equal and within the operating range of the amplifier, the current in the output stage, i.e., transistors 120, 122, 132, 134, is balanced. When the inputs 112, 110 have a differential voltage between them, the output stage has a current imbalance and either pulls high or low. The external load capacitance and feedback serve to give the amplifier 4 compensation and closed loop functionality. If there is no feedback or compensation, the circuit behaves instead as a comparator. One significant aspect of the amplifier 4 which gives the amplifier 4 its favorable characteristics for low supply voltage applications is the particular implementation of the current mirror load, formed of transistors 120, 122, 128, 130. The cascode transistors 122, 130 with the signal 202 and the method of mirroring the gate voltage from transistors 128, 120 allows the amplifier 4 to exhibit favorable operating characteristics, even in low supply voltage applications. Through these particular aspects, the amplifier's transistors are maintained in saturation and the use of the cascoded load improves power supply rejection. These characteristics of the amplifier 4 can be better understood by considering the particular circuitry and variables involved in a typical application of the amplifier 4.

Figure 4:
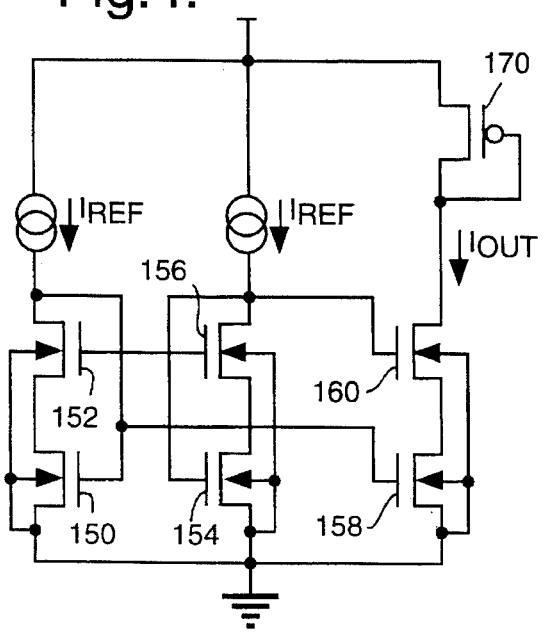
FIG. 4 is a detailed illustration of the DC biasing and current mirroring circuitry of the preferred embodiment of the amplifier circuit of the present invention of FIG. 3.

Referring now to FIG. 4, an illustration of the DC biasing circuitry of the present invention amplifier 4 is shown. This new biasing circuit creates equal $V_{ds}$ voltages across transistors 150, 158 that results in more accurate current matching and less changes for variations in process, temperature, supply voltage, or $I_{ref}$ current. This DC biasing circuit requires that transistors 152, 156, 160 (and also transistor 164 in the amplifier circuit shown in FIG. 3) be sized the same, or as unit multiples, and transistors 150, 158 be sized the same, or as unit multiples. The size of transistor 154 is set so that the desired $V_{ds}$ is derived across transistors 150, 158 (and transistor 162 in FIG. 3) so they remain in saturation (typically 1.3 $V_{dsat}$). As a result of this technique, all of the critical transistors are the same size as or unit multiples of each other (except for transistor 154 which sets the $V_{ds}$ for transistors 150, 158) (and 162 in FIG. 3), and the cascode and sinking devices may be varied in size and still maintain close matching.

Continuing to refer to FIG. 4 and now in conjunction with FIG. 2, in effect, the addition in the present invention of transistor 154 to the DC biasing circuitry serves to set the potential across transistor 150 equal to the potential across transistor 158, to get a true current mirror. The middle stage of the biasing circuitry, i.e., transistors 154, 156, establishes the voltages on the cascode devices, so that the gate to source drop of transistor 152 will drive transistor 150 to an appropriate $V_{ds}$ voltage. Further note that the gate of transistor 150 is, instead of being tied back to drain, tied to the other side of the cascode device so that it picks up the potential, i.e., the additional potential, so that the currents will be mirrored correctly and will have the same drainage source.

Still referring to FIG. 4 in conjunction with FIG. 2, in the single stage amplifier section of the amplifier 4, this same biasing technique is employed to bias 196 the n-channel cascode devices 134, 138 and to set up the bias 198 for the n-channel sink devices 132, 136. Note also that, in a similar fashion, currents are mirrored so that bias voltage 204 biases the p-channel device 124 and bias voltage 202 sets up the bias voltage for the cascode transistors 122, 126, 130. The current mirroring is accomplished through transistor 128 and transistor 120. Note also that the gate of transistor 128 is not connected to its drain, but is instead connected to the drain on the other side of transistor 130. This connecting technique allows for creation of additional gate voltage, so when the current is mirrored the drain voltage on transistors 128 and 120 will be the same.

Figure 5:
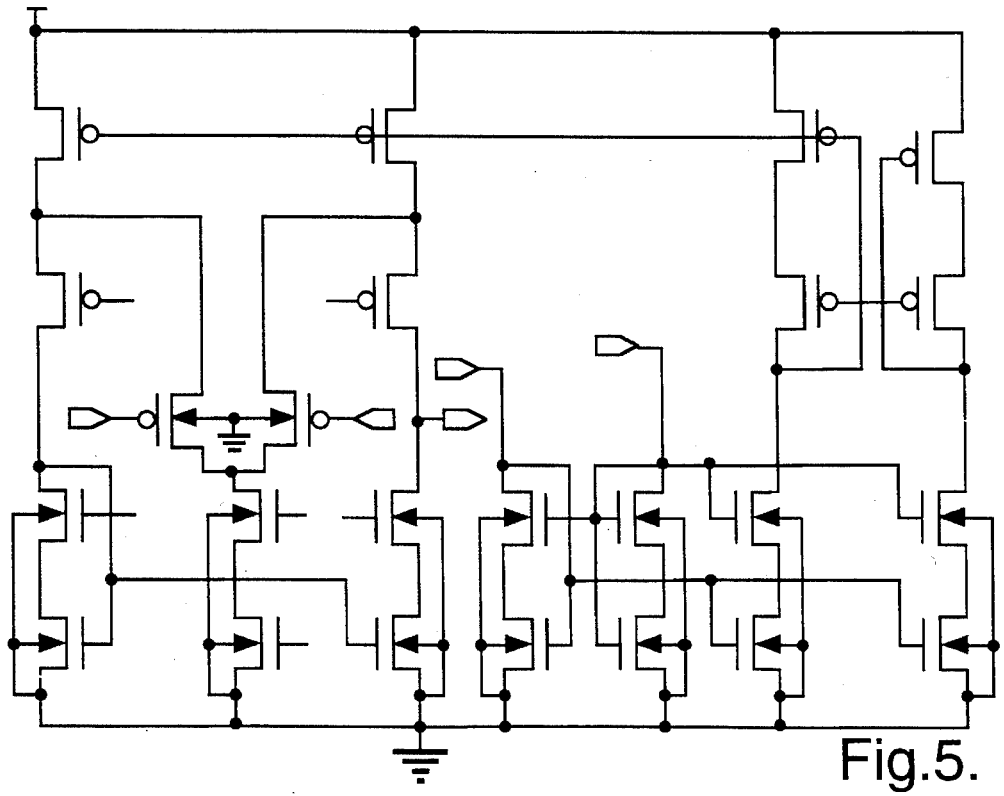
FIG. 5 is a detailed schematic representation of the complimentary version single ended amplifier of that shown in FIG. 3.

Next referring to FIG. 5, a complementary, inverted version of the operational amplifier of the present invention is shown. This complementary, inverted version performs in the same manner as the embodiment depicted in FIG. 3, but is the exact complement of the FIG. 3 circuit.

Figure 6:
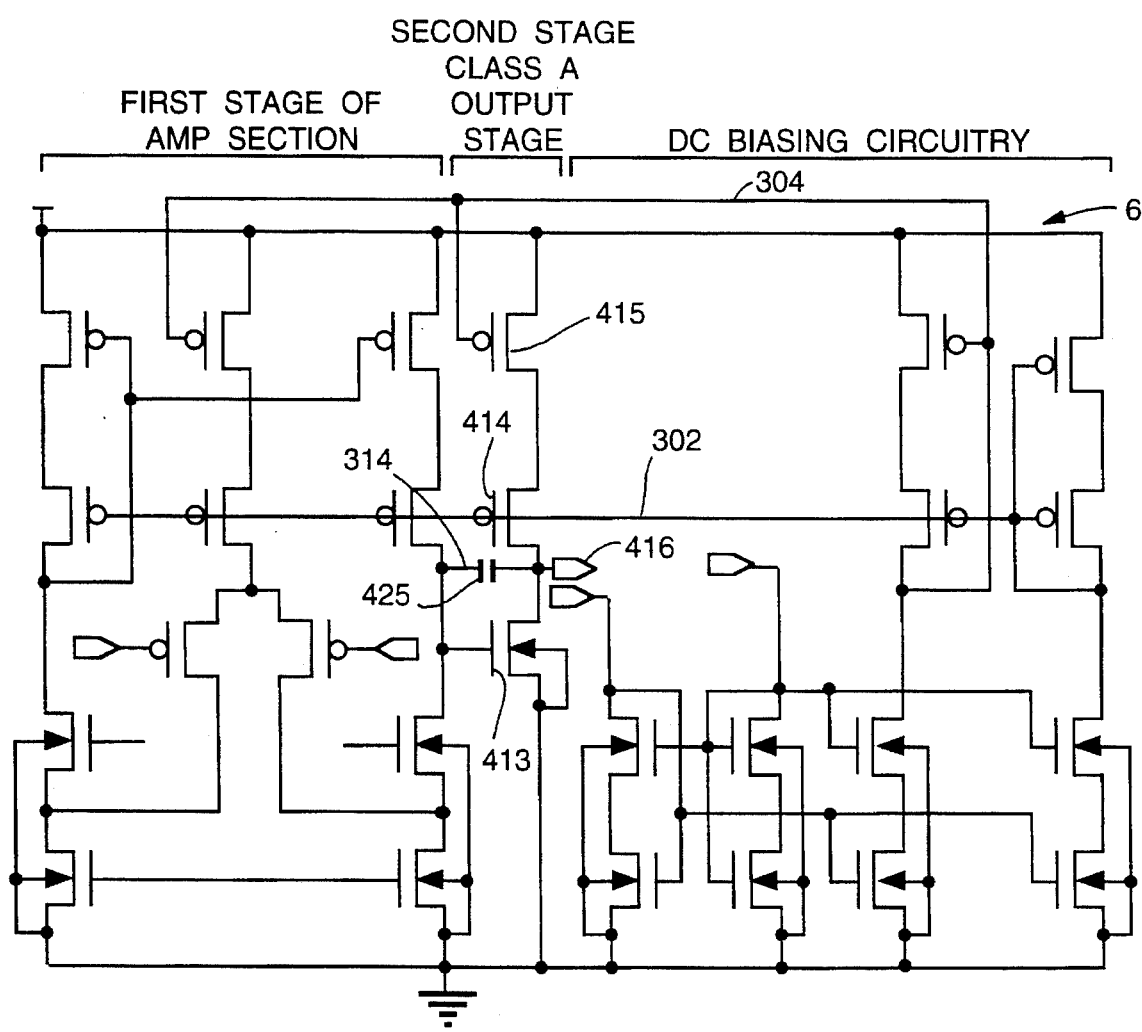
FIG. 6 is a detailed schematic representation of the preferred embodiment of a two stage Class A operational amplifier incorporating the DC biasing and current mirroring schemes of the present invention.

Now referring to FIG. 6, a two stage Class A operation amplifier 6, incorporating the techniques of the present invention, is illustrated. This amplifier 6 consists of a single stage amplifier section (like that of the device in FIG. 3) and a network of DC biasing circuitry (like that of the device in FIGS. 3 and 4). The second stage of the amplifier 6 is a Class A output stage. The incorporation of the Class A output stage with the single stage amplifier section thus forms a generic two stage Class A operational amplifier. In this embodiment, transistors 413, 414, 415 and capacitor 425 form the output stage. Transistors 414, 415 create a constant current source, while transistor 413 derives the output level based on its gate potential supplied from the first stage output 314. The circuitry sets up a current source which is biased from the same biasing sources 302, 304 as in the single stage amplifier 4 design (FIG. 3). Transistor 413, in effect, acts as a "throttle" to modulate the output 416. As the gate of the transistor 413 goes up, it puts more drive on the transistor to pull the output down and as the gate goes down, it turns the device off and allows the output to pull up.

Continuing to refer to FIG. 6, those skilled in the art will recognize that numerous variations in the configuration and elements may be possible without departing from the functions of the device and the manner in which it accomplishes those functions. As an example of one alternative design, notwithstanding there are many others and so this example is not intended to be limiting, a pole-zero compensation, rather than the pole-splitting compensation described above, may be employed. This can be accomplished in the two stage amplifier 6 by replacing the capacitor 425 with a series resistor and capacitor. In other examples, further multiple stage, complementary arrangements, and other modifications, additions, and deletions may be made in the designs without departing from the intended scope of the description of the invention herein.

As is clearly seen, the present invention overcomes the problems presented by the prior art devices. The present invention is believed to be especially effective when configured and employed as described herein, however, those skilled in the art will readily recognize that numerous variations and substitutions may be made in the device and its use and configuration to achieve substantially the same results as achieved by the embodiments and, in particular, the preferred embodiments expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. An operational amplifier, comprising:

an inverting input;

a non-inverting input;

an output; and means for connecting said inverting input and said non-inverting input and said output;

means, connected to said output, for pushing said output high;

means, connected to said output, for pulling said output low;

wherein said means for pushing is at least one source transistor and said means for pulling is at least one sink transistor;

wherein said means causes said output to swing over substantially the entire range of power supply voltage; and wherein said means for connecting includes DC biasing circuitry, said DC biasing circuitry including four identically sized n-channel transistors, three of said n-channel transistors receiving a second bias current input and one of said n-channel transistors receiving a first bias current input, and three identically sized n-channel sink transistors connected to said n-channel transistor receiving said first bias current input and to two of said n-channel transistors receiving said second bias current input, another of said n-channel transistors receiving said second bias current input and being connected to a select transistor having desired characteristics to maintain current mirroring between each of said at least one source transistors and between each of said at least one sink transistors, thereby causing said at least one source transistors and said at least one sink transistors to remain in the saturation region for the entire range of output swing.

2. A method of biasing an operational amplifier having dual inputs and a single-ended output, said amplifier comprised of sinking transistors and sourcing transistors and corresponding biasing transistors, comprising the step of:

sizing at least one correcting transistor to account for voltage differential between dual biasing currents across said biasing transistors to yield substantially identical biasing currents to all of said sinking transistors and substantially identical biasing currents to all of said sourcing transistors and all of said sinking transistors.

3. The method of claim 2, further comprising the step of:

connecting cascode transistors to each of said sourcing transistors and said sinking transistors.

4. The method of claim 2, further comprising the step of supplying a power supply voltage of from about 0 volts to about 2.7 volts.

5. The method of claim 2, further comprising the step of supplying a power supply voltage of from about 0 volts to about 5 volts.

* * * * *